Feb. 11, 1958 J. C. SIMS, JR 2,823,321

GATE AND BUFFER CIRCUITS

Filed May 3, 1955 2 Sheets-Sheet 1

INVENTOR.
JOHN C. SIMS, JR.
BY
Charles C. English
AGENT

Feb. 11, 1958 J. C. SIMS, JR 2,823,321

GATE AND BUFFER CIRCUITS

Filed May 3, 1955 2 Sheets-Sheet 2

INVENTOR.
JOHN C. SIMS, JR.
BY
Charles C. English
AGENT

United States Patent Office 2,823,321

Patented Feb. 11, 1958

2,823,321

GATE AND BUFFER CIRCUITS

John C. Sims, Jr., Springhouse, Pa., assignor, by mesne assignments, to Sperry Rand Corporation, New York, N. Y., a corporation of Delaware Application May 3, 1955, Serial No. 505,709

19 Claims. (Cl. 307—88)

The present invention relates to control circuits such as may be employed for gating and buffing operations, and in various electronic devices; and more particularly relates to such structures relying for their operation upon reverse transient phenomena observed in semiconductor devices.

In general, a semiconductor device may be defined as one presenting a relatively low impedance to forward current flow and presenting a relatively high impedance to current flow in an opposing or back direction. Forward currents may, of course, be effected through such a semiconductor by applying a potential thereto which renders the anode more positive than the cathode thereof; and in general, if an inverse potential is applied to such a semiconductor device, only a negligible back current will flow under steady state conditions. In practice, it has been found, however, that forward current flow through a semiconductor device tends to effect a storage of excess holes or electrons in the lattice of the solid state material, whereupon if the semiconductor is then suddenly subjected to an inverse potential large enough to cut off forward current flow, a large reverse transient initially flows which may in fact exceed the forward current in magnitude. This transient current results from the sweeping out of unrecombined injected carriers from the semiconductor device and the said transient current ordinarily decays after a relatively short time interval to the normal value of back leakage current. The large transient current effected by the applied inverse voltage is termed "enhancement," and such an enhancement phenomenon is exhibited in some degree by all semiconductors utilizing material into which minority carriers may be injected, such as germanium and silicon.

The present invention relates to control devices utilizing this enhancement effect of semiconductor devices, and is more particularly concerned with gating and buffing circuits employing such effects.

It is accordingly an object of the present invention to provide an improved gate.

A further object of the present invention resides in the provision of an improved buffer.

Still another object of the present invention resides in the provision of gate and buffer circuits utilizing semiconductor devices.

A feature of the present invention resides in the provision of semiconductor devices utilizing the enhancement effects observed in semiconductor rectifiers.

A further object of the present invention resides in the provision of gating and/or buffing circuits which may be made in relatively small sizes.

In accordance with the present invention, there are a plurality of interconnected amplifier stages, each of which employs a semiconductor rectifier exhibiting enhancement effects. In practice, the said amplifiers may have a utilization circuit coupled to one terminal thereof, and this utilization circuit is in turn preferably responsive to current flows in a predetermined direction exceeding a predetermined minimum.

In operation, and when an output is desired from a particular amplifier stage utilizing such a semiconductor rectifier, current is initially caused to flow through the said semiconductor rectifier in a forward direction whereby carriers are injected into the semiconductor device. A relatively large inverse potential is then applied to the said rectifier whereby enhancement current flows therethrough in a reverse direction, and this enhancement current is operative to effect a desired output from a particular amplifier stage to the said utilization circuit.

In a preferred form of the invention, a single utilization circuit may be coupled to a plurality of amplifier stages of the type described above; and this utilization circuit may include a transformer preferably, but not necessarily, employing a core of magnetic material exhibiting a substantially rectangular hysteresis loop. The transformer is, in addition, so biased that it is responsive primarily to enhancement currents exceeding a predetermined minimum whereby sneak currents and spurious current flows are substantially ineffective in producing a desired output from the said utilization circuit. By this arrangement, therefore, a relatively small control device, which may act as a gate, a buffer, or as both a gate and buffer, may be effected and this control device will in turn have extremely good operating characteristics.

The foregoing objects, advantages, construction and operation of the present invention will become more readily apparent from the following description and accompanying drawings, in which.

Figure 1:
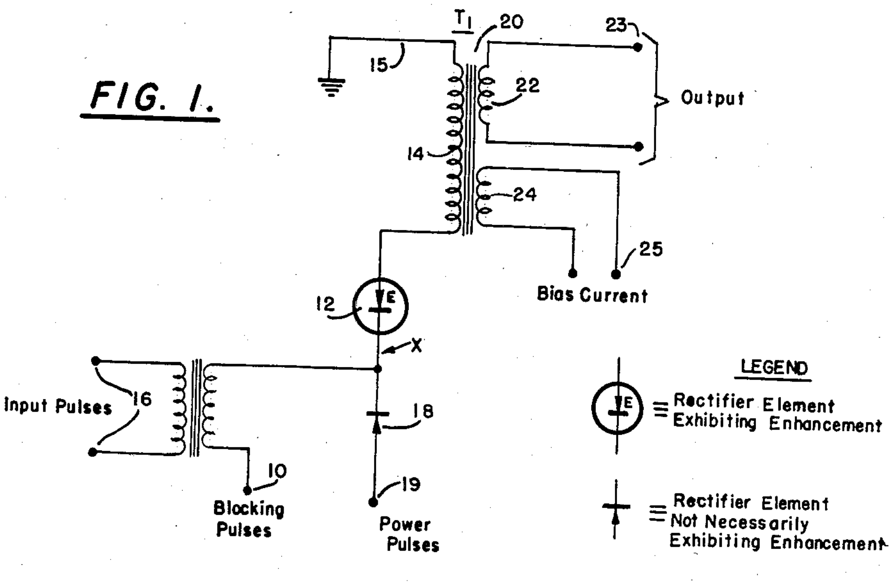
Figure 1 is a schematic diagram of an enhancement amplifier that may be used in the circuit of the present invention and includes a legend identifying the symbols employed.

Referring now to Figure 1, it will be noted that an amplifier device that may be used in the circuit of the present invention may comprise a hysteresis element such as a semiconductor rectifier 12. This device of Figure 1 is descibed and claimed in applicant's copending application S. N. 505,707, filed concurrently herewith. The said rectifier 12 may in fact take the form of a semiconductor diode and this rectifier is characterized by the fact that it can be caused to selectively conduct a relatively high transient current in its back direction due to the storage of excess holes or electrons in the lattice structure thereof, during a previous history of conduction in a forward direction. In short, the semiconductor rectifier 12 is so chosen that it exhibits substantial enhancement. One terminal of the said rectifier (the anode thereof in the arrangement of Figure 1) is coupled to a winding 14 of a transformer T1 and the other end of the said winding 14 is preferably grounded at a point 15. Transformer T1, in addition, comprises a core 20 of magnetic material, preferably, but not necessarily, exhibiting a hysteresis loop which is substantially rectangular in configuration. The core material may, for instance, comprise 4–79 Molypermalloy, Orthonik or other materials exhibiting hysteresis loops of the type shown in Figure 3, such materials being well known in the art. Transformer T1 carries an output winding 22 thereon, whereby outputs may be taken selectively at a point 23, and also includes bias means such as a winding 24 coupled to a source of bias current 25 for causing the said transformer T1 to operate at a predetermined point on its hysteresis loop under quiescent conditions.

The lower terminal of rectifier 12 (the cathode in the arrangement of Figure 1), is coupled to one terminal of a further rectifier 18 which may again comprise a semiconductor rectifier or other form of rectifier known in the art; and the rectifier element 18 need not necessarily exhibit enhancement although, as will become apparent from the subsequent discussion, the occurrence of such enhancement effects in the said rectifier 18 will not detract from the operation of the circuit. Rectifier element 18 is poled in a direction opposite to that of rectifier element 12, and a source of regularly occurring positive and negative-going driving pulses 19 of the configuration shown in Figure 2A, may be coupled to the lower terminal or anode of the said rectifier 18. By this arrangement, it will be seen that the winding 14 and rectifiers 12 and 18 comprise a series-connected circuit having two rectifiers therein of opposite polarity with respect to one another and having a source of driving or power pulses coupled to one end of the said series circuit. In addition, a source 16 of selective input pulses, of the configuration shown in Figure 2B, may be coupled to the rectifier 12, for instance to the common electrode connection of the said rectifiers 12 and 18, via an input transformer whereby the amplifier device will operate in the manner subsequently to be described. The secondary winding of the said input transformer may be supplied from a source 10 of blocking pulses (Figure 2E) to prevent reaction on the input by the applied power pulses 19; in a well known manner, a blocking diode (not shown) may be used in cooperation with these blocking pulses for this purpose.

It should be noted that while the circuit of Figure 1 has coupled the cathodes of rectifiers 12 and 18 to one another, this particular connection is not mandatory and in fact the anodes of the said two rectifiers may be coupled to one another provided the polarities of input pulse source 16 and bias current source 25 are changed appropriately.

Considering now the broad operational characteristics of the circuit shown in Figure 1, it will be noted that, in general, no current may flow in the series circuit comprising rectifiers 12 and 18, transformer winding 14 and ground connection 15, due to the application of power pulses from the source 19. When these power pulses are positive-going in nature, current flow through the series circuit is blocked by rectifier 12, while current flow due to negative-going power pulses is similarly blocked by rectifier 18. If an input pulse should be applied to terminal 16, however, during the application of a negative-going power pulse from source 19, rectifier 12 will be caused to conduct in a forward direction, thereby storing holes or electrons in its lattice structure. The subsequent application of a positive-going power pulse from the source 19 will, therefore, effect an appreciable current flow through the series circuit and this current flow will in turn comprise forward current flow through the rectifier 18, and enhancement current flow through the rectifier 12. As has been mentioned previously, this enhancement current, although transient in nature, is of relatively large magnitude and passes through the winding 14 of transformer T1 to ground terminal 15, whereby a usable output may be taken across the transformer winding 22 at terminal 23.

Figure 2:
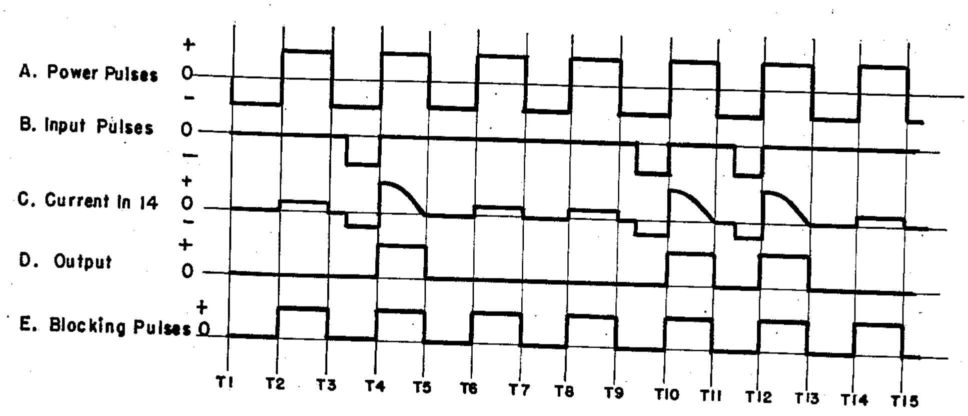
Figure 2 (A through E) are waveform diagrams illustrating the operation of the circuit shown in Figure 1.
Figure 3:
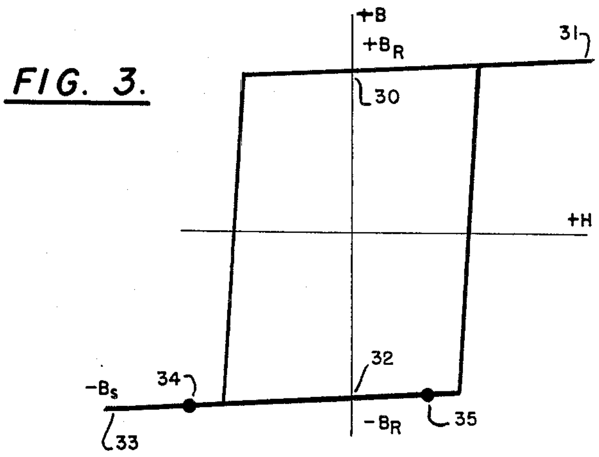
Figure 3 is an idealized representation of the hysteretic characteristic of core materials which may preferably, but not necessarily, be employed in the arrangement of Figure 1.

The foregoing operation of the present invention will become more readily apparent from a consideration of the waveforms shown in Figure 2, and of the hysteresis loop shown in Figure 3. Referring initially to the said Figure 3, it will be noted that core 20 may comprise a material exhibiting a substantially rectangular hysteresis loop and such a core material will exhibit a plus remanence operating point 30, a plus saturation region 31, a minus remanence operating point 32, and a minus saturation region 33. D. C. bias current from source 25, flowing through winding 24 of transformer T1, is so chosen in magnitude that core 20 operates under quiescent conditions at a point 34 in its minus saturation region, and this quiescent operating condition serves to provide a threshold for the operation of the transformer T1 whereby relatively small positive and negative current flows through winding 14 are substantially ineffective in producing usable outputs at terminal 23.

Considering the waveforms of Figure 2, it will be seen that during a time interval *t1* to *t2*, for instance, a negative-going power pulse may be applied from the source 19 to the anode of rectifier 18 and this negative-going pulse will be ineffective in causing current flow through the series circuit described previously inasmuch as rectifier 18 will be disconnected. During a next subsequent time interval *t2* to *t3*, a positive-going power pulse from source 19 tends to cause current conduction in the series circuit described. This current conduction is limited to the relatively small value of back current flow through rectifier 12 and is represented by the small positive-going pulse through coil 14, shown in Figure 2C, for this time interval. Due to the biasing of transformer T1, described above, this small positive-going pulse of current through winding 14 may drive core 20 from its initial operating point 34 to a further operating point 35, but, as will be seen from an examination of Figure 3 and since the points 34 and 35 each comprise operating points in a relatively saturated region of core 20, the small positive-going pulse effected by the application of a positive-going power pulse during the time interval *t2* to *t3* effects a relatively small flux change in the said core 20. As a result, substantially no output appears at terminal 23, and any such small output may in fact be completely suppressed by a clamp circuit coupled to the said output winding 22. Thus, in the absence of input pulses, positive and negative-going power pulses from the source 19 produce no output at terminal 23.

If now a negative-going input pulse should be applied from the source 16 during a time interval *t3* to *t4*, this applied input pulse will lower the potential of the cathode of rectifier element 12 with respect to the anode thereof, whereby a small current will pass from ground through transformer winding 14 and thence through rectifier 12 in a forward direction. This small current flow through winding 14, due to the application of the said input pulse from source 16, is again ineffective to produce an output at terminal 23 inasmuch as it merely tends to drive core 20 from its operating point 34 deeper into its negative saturation region 33, again producing substantially no flux change in the said core 20. The forward current flow through rectifier 12, due to the application of the said input pulse from source 16 is, however, effective to store holes or electrons in the lattice structure of the semiconductor element 12. If then a positive-going power pulse from the source 19 should be applied during the time interval *t4* to *t5*, this applied positive-going power pulse effects a relatively large current flow through the series circuit which current flow comprises forward current through rectifier 18 and enhancement current through rectifier 12. The enhancement current is, of course, in a back direction through rectifier 12, and is substantially transient in nature, as shown in Figure 2C, for the time interval *t4* to *t5*. This transient current passing through winding 14 of transformer T1 is nevertheless of sufficient magnitude to drive core 20 from its operating point 34 past minus remanence operating point 32, into the positive saturation region 31 of the core 20. As a result, the enhancement current flow effects a relatively large flux change in core 20 whereby a substantial potential is induced in winding 22 and may be taken at output point 23.

During a next subsequent time interval *t5* to *t6*, the bias source 25 drives core 20 from its operating point 31 back into its negative saturation region, whereby core 20 once more operates at point 34 preparatory to further application of an input signal. A further operating sequence, corresponding to the application of two successive input signals, is shown for the total time interval *t9* to *t15* and the operation of the device for this further time interval is analogous to that described previously.

As will be appreciated from the foregoing, the transformer T1 cooperates with the remainder of the circuit in such a manner that sneak signals present in winding 14 are completely ineffective in producing outputs at the terminal 23; and in addition, the transformer T1 serves to properly shape output signals appearing at the said terminal 23, whereby they may be utilized directly in further circuits. In addition, it should be noted that while rectifier 18 may have less enhancement than rectifier 12, this is by no means a mandatory requirement, and satisfactory operation will in fact be effected even when rectifier 18 has appreciable enhancement, so long as the input signal is delayed sufficiently to permit enhancement current of rectifier 18 to be drained off. In this respect it will be observed that during time periods when transformer T1 is operating in its negative saturation region, its impedance to the flow of current is small and in fact may appear as essentially a short-circuit. Thus, even if rectifier 18 should exhibit appreciable enhancement, the negative portions of applied power pulses from source 19 will readily pull such enhancement current out of rectifier 18, since electrons will flow readily from ground through winding 14, and thence through rectifier 12 in its forward direction. Rectifier 18 thus will rapidly be cleaned up and the clean-up currents flowing in coil 14 are once more ineffective in providing outputs at terminal 23 inasmuch as they are of such direction with respect to winding 14 that they tend to drive the said core 20 deeper into its negative saturation region. Any enhancement of rectifier 12 by power pulses during such clean up of rectifier 18 decays by recombination, and suitable power pulse rates to permit such recombination may be provided.

Figure 4:
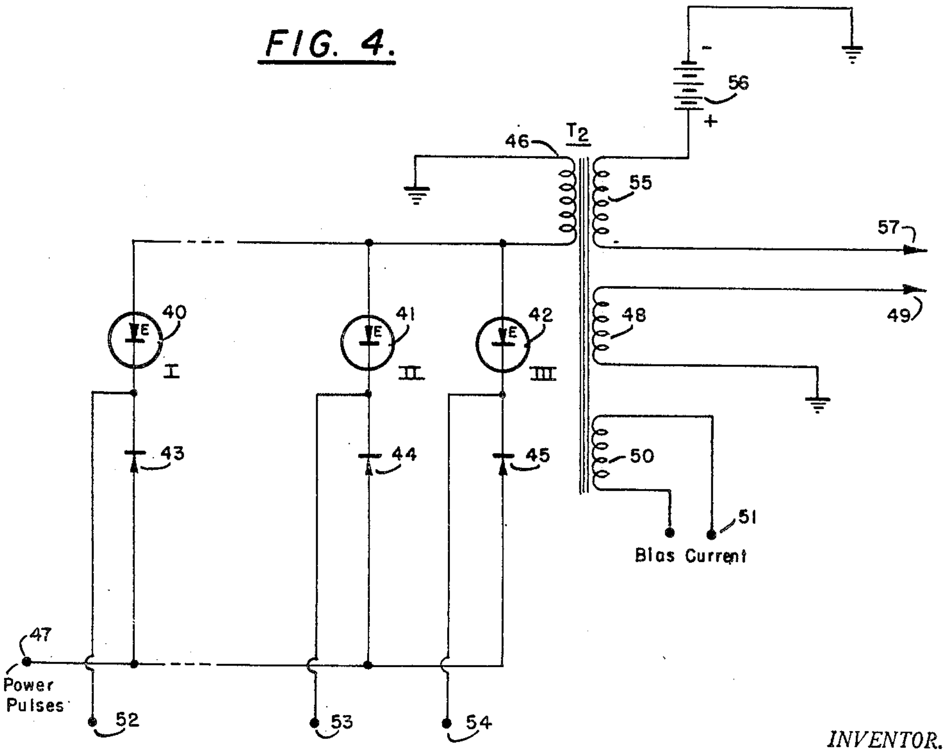
Figure 4 is a schematic diagram of a circuit acting as a gate and/or as a buffer in accordance with the present invention.

Amplifiers of the type shown in Figure 1 may be utilized to provide gating and/or buffing circuits in accordance with the present invention; and one such embodiment is illustrated in Figure 4. Thus, referring to the said Figure 4, it will be seen that a plurality of such amplified stages I, II, III, etc. may be employed, and these amplifier stages will comprise a first plurality of semi-conductor rectifiers 40, 41, 42, etc., exhibiting enhancement effects, and a second plurality of rectifiers 43, 44, 45, etc. not necessarily exhibiting enhancement. The several amplifier stages are coupled at their upper ends to an input winding 46 of a transformer T2 of the type described previously, and are coupled at their lower ends to a common source 47 of positive and negative-going power pulses. A blocking pulse source similar to source 10 of Figure 1 may, if desired, also be provided. Transformer T2 again includes an output winding 48 whereby buffed outputs may be taken selectively at an output point 49, and the said transformer also includes a bias winding 50 supplied by a source 51 of bias current in accordance with the preceding discussion. A plurality of independent signal sources 52, 53, 54, etc., may be coupled respectively to the several amplifier stages in the manner described in reference to Figure 1.

The arrangement thus far described, comprising transformer T2 with its output winding 48, acts as a buffer circuit and, as will be appreciated from the subsequent discussion, a plurality of windings analogous to 48 may in fact be supplied whereby a plurality of substantially independent buffed outputs may be obtained. In addition, transformer T2, in the arrangement shown in Figure 4, carries a further winding 55 coupled at one of its ends to a bias source 56 and at the other of its ends to an output point 57. As will be described subsequently, winding 55 with its associated bias source 56, acts to provide a gate output at terminal 57 and once more a plurality of such gate outputs may be provided on transformer T2. Thus, the circuit of Figure 4 acts as a combined buffer and gate, but it will be appreciated that by eliminating or duplicating appropriate windings, a buffer, a gate, or a combined buffer and gate having one or more outputs, may be effected, as desired.

The operation of the circuit shown in Figure 4 becomes readily apparent from a consideration of the description given with respect to Figure 1. In operation, rectifier groups 40—43, 41—44, and 42—45 operate individually in the manner described in reference to rectifiers 12—18 of Figure 1. Thus, the application of an input pulse to terminal 52, during the occurrence of a negative-going power pulse from source 47, causes enhancement current to flow through rectifier 40 during the next subsequent positive-going power pulse. Similarly, inputs at terminals 53 and/or 54 cause enhancement current subsequently to flow through rectifiers 41 and/or 42. Interaction between the several amplifier portions I, II and III is prevented by the usual operation of the several diodes shown, as well as by an appropriate blocking pulse source, if utilized. In this manner, therefore, a signal applied to any one of terminals 52, 53 and/or 54, effects an appreciable current flow through transformer winding 46 to ground, whereby an output will appear across winding 48 and may be taken at terminal 49. Should more than one, or even all, of the input lines 52, 53 and 54 be signalled, the output currents will be cumulative in transformer winding 46. It will be found, however, that in normal operation, the enhancement output of a single diode amplifier is sufficient to drive the core of transformer T2 to or into saturation. Thus, further current as may be effected by the operation of more than one amplifier, will produce no additional output across output winding 48 inasmuch as the core of transformer T2 is saturated by operation of one only of the said diode amplifiers. The circuit, including winding 48, thus acts as a buffer inasmuch as excitation of any one or more of inputs 52, 53 and 54 will produce an output at the terminal 49 which can be utilized in subsequent circuits.

Winding 55, in conjunction with bias source 56, produces an output at terminal 57 corresponding to action of the circuit as an inhibition type gate. Due to the action of bias source 56, signals obtained at terminal 57 will be referenced from a positive potential, whereby a normally "on" signal will appear at the said terminal 57. This "on" signal is bucked out, however, by any potential induced in winding 55, due to enhancement outputs from one or more of the amplifier sections I, II, III, etc. Thus, if no inputs appear at any of the terminals 52, 53, 54, etc., a positive signal output may be taken from terminal 57, while the application of one or more signal inputs will cancel the effect of bias source 56, reducing the potential of terminal 57 substantially to ground. The circuit including winding 55 thus constitutes a gate. It should further be noted that a gating circuit, operating in accordance with the preceding discussion, may be so arranged that an input to one only of the diode amplifier sections does not produce a sufficient output potential across winding 55 to completely cancel the effect of potential source 56, whereby more than one input line must be signalled to completely buck out the potential of the said source 56. Further variations will be suggested to those skilled in the art.

As has been mentioned previously, the arrangement of Figure 4 combines the functions of both gating and buffing in a single circuit. By elimination of winding 48, a gate alone is provided; and by providing further windings and potential sources analogous to 55 and 56, plural gated outputs may be supplied. In addition, by elimination of winding 55, the arrangement utilizing winding 48 acts as a buffer alone and plural windings analogous to 48 may be supplied thereby to provide plural buffed output points.

While I have described a preferred embodiment of the present invention, many variations will be suggested to those skilled in the art. Thus, the circuit of Figure 4 behaves as a buffer for pulses (assuming that a binary digit "one" is signified by the presence of a signal) and behaves as a gate for complements. Outputs typified by 49 and 57 thus give, respectively, pulses and complements and the circuit of Figure 4 may be considered as both an "and" circuit whose output can be the complement of its input, and as an "or" circuit having the same property. In addition, it should be noted that arithmetic circuits, such as adders, multipliers, shifting registers, counters, and the like, may ordinarily consist of gate-buffer chains; and inasmuch as the foregoing discussion has illustrated the provision of a novel form of gate-buffer chain, variations wherein such a chain or chains are interconnected to effect a logical circuit will be suggested to those skilled in the art and are contemplated by the present invention. The foregoing discussion is therefore meant to be illustrative only and is not limitative of my invention, and all such variations as fall within the principles discussed above, are intended to come within the scope of the appended claims.

Having thus described my invention, I claim:

1. A control circuit comprising a core of saturable magnetic material, means for saturating said core in a predetermined direction, a winding on said core, a plurality of semiconductor rectifiers each of which has a terminal thereof coupled to said winding, control means for effecting forward current flow through selected ones of said rectifiers thereby to condition said selected rectifiers for reverse current flow therethrough, and drive means for thereafter driving current in a reverse direction through said conditioned rectifiers and thence through said winding thereby to drive said core through an unsaturated region of its hysteresis loop.

2. The circuit of claim 1 wherein said control means comprises a plurality of signal sources coupled respectively to said plurality of rectifiers.

3. The circuit of claim 1 wherein said core carries an output coil inductively coupled to said winding.

4. The circuit of claim 3 including bias potential means coupled to said output coil, whereby an output potential is effected by said coil in the absence of enhancement current in any of said rectifiers.

5. The control circuit of claim 1 wherein said core comprises a magnetic material exhibiting a substantially rectangular hysteresis loop.

6. A control circuit comprising a core of saturable magnetic material exhibiting a substantially rectangular hysteresis loop, bias means for saturating said core in a predetermined direction, a winding on said core, a plurality of semiconductor rectifiers coupled in parallel and to one end of said winding, a plurality of selective signal sources coupled respectively to said plurality of rectifiers and tending to supply current therethrough in a certain direction to said winding to drive said core in said predetermined direction, said rectifiers each being responsive to signals from its corresponding signal source for making available enhancement current flow through said rectifier and thence through said winding in the opposite direction, whereby said core is adapted to be driven toward saturation in a direction opposite said predetermined direction in response to the occurrence of a signal from at least one of said signal sources.

7. The circuit of claim 6 wherein said core carries an output coil inductively coupled to said winding.

8. The circuit of claim 7 and further including bias potential means coupled to said output coil.

9. A control circuit comprising a core of saturable magnetic material, bias means for saturating said core in a predetermined direction, a winding on said core, a plurality of semiconductor rectifiers coupled in parallel and to one end of said winding, a plurality of selective signal sources coupled respectively to said plurality of rectifiers and operative to supply signals thereto and to said winding to produce a magnetizing action in said predetermined direction, a driving source coupled to said rectifiers, said rectifiers each being responsive to signals from its corresponding signal source whereby said driving source effects enhancement current flow through selected ones of said rectifiers and thence through said winding to produce a magnetizing action in the opposite direction.

10. The circuit of claim 9 wherein said core carries an output coil inductively coupled to said winding.

11. The circuit of claim 9 wherein said core carries a plurality of output coils each of which is inductively coupled to said winding.

12. The circuit of claim 11 including further bias means coupled to at least one of said plurality of output coils.

13. A control circuit comprising a plurality of amplifier stages connected in parallel with one another, each of said stages separately comprising first and second rectifiers connected in series combinations with one another and of opposite polarity to one another, a plurality of signal sources coupled respectively to said plurality of amplifier stages and operative to supply signals tending to produce a current in the forward direction through said first rectifiers to produce an enhancement effect therein, driving means coupled to one end of each of said combinations of series connected rectifiers and operative to supply signals tending to produce a current in the back direction through said first rectifiers, and a common utilization circuit coupled to the other end of each of said combinations of series connected rectifiers.

14. The control circuit of claim 13 wherein said utilization circuit includes threshold producing means whereby said utilization circuit is responsive only to current flows through said combinations of series connected rectifiers of a predetermined polarity and in excess of a predetermined minimum value.

15. A control circuit comprising a plurality of amplifier stages connected in parallel with one another, each of said stages separately comprising first and second rectifiers connected in series combinations with one another and of opposite polarity to one another, a plurality of signal sources coupled respectively to said plurality of amplifier stages and operative to supply signals tending to produce a current in the forward direction through said first rectifiers, driving means coupled to one end of each of said combinations of series connected rectifiers and operative to supply signals tending to produce a current in the back direction through said first rectifiers, and a common utilization circuit coupled to the other end of each of said combinations of series connected rectifiers, said utilization circuit including a transformer, having a core of magnetic material exhibiting a substantially rectangular hysteresis loop, first and second windings on said core, means coupling said first winding to the said other ends of said amplifier stages, and means for taking outputs from said second winding.

16. A control circuit comprising a plurality of amplifier stages connected in parallel with one another, each of said stages separately comprising first and second rectifiers connected in series with one another and of opposite polarity to one another, at least one of said rectifiers in each of said stages comprising a semiconductor material exhibiting enhancement, a drive source coupled to one end of each of the series combinations of said series connected rectifiers, a common utilization circuit coupled to the other end of each of said combinations of series connected rectifiers, and a plurality of control means coupled respectively to said plurality of amplifier stages for enhancing respective ones of said rectifiers and thereby controlling current flow from said drive source through selected ones of said semiconductor rectifiers to said utilization circuit.

17. The control circuit of claim 16 wherein said utilization circuit includes a core of magnetic material exhibiting a substantially rectangular hysteresis loop, and means tending to saturate said core in a predetermined direction in the absence of enhancement current flow in any of said amplifier stages.

18. The control circuit of claim 17 and further including an input winding on said core, means coupling one end of said input winding to said other end of each of said series connected rectifiers, and a plurality of output windings on said core inductively coupled to said input winding.

19. A control circuit comprising a plurality of semiconductor rectifiers, a utilization circuit having an input, means coupling said input to one electrode of each of said rectifiers, control means for effecting forward current flow through selected ones of said rectifiers thereby to condition said selected rectifiers for reverse current flow therethrough, and drive means coupled to said plurality of rectifiers, said drive means being operative subsequent to initial operation of said control means for effecting reverse current flow through said conditioned rectifiers to said input of said utilization circuit.

No references cited.